United States Patent
Deckman et al.

(10) Patent No.: US 10,284,237 B2
(45) Date of Patent: *May 7, 2019

(54) SYSTEMS AND METHODS FOR A PREDISTORTION LINEARIZER WITH FREQUENCY COMPENSATION

(71) Applicant: Mission Microwave Technologies, LLC, Santa Fe Springs, CA (US)

(72) Inventors: Blythe C Deckman, Eastvale, CA (US); Michael P DeLisio, Jr., Monrovia, CA (US); Amir Halperin, Petah Tikva (IL)

(73) Assignee: Mission Microwave Technologies, LLC, Santa Fe Springs, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/784,100

(22) Filed: Oct. 14, 2017

(65) Prior Publication Data
US 2018/0175893 A1    Jun. 21, 2018

Related U.S. Application Data

(63) Continuation of application No. 15/072,313, filed on Mar. 16, 2016, now Pat. No. 9,793,932.
(Continued)

(51) Int. Cl.
*H03F 1/32* (2006.01)
*H04B 1/04* (2006.01)

(52) U.S. Cl.
CPC ......... *H04B 1/0475* (2013.01); *H03F 1/3241* (2013.01); *H04B 2001/0425* (2013.01)

(58) Field of Classification Search
CPC ........ H03F 3/24; H03F 1/3241; H03F 1/3282; H03F 2201/3212; H03F 3/189;
(Continued)

(56) References Cited

U.S. PATENT DOCUMENTS 3,383,618 A    5/1968 Engelbrecht
3,755,754 A    8/1973 Putz
(Continued)

OTHER PUBLICATIONS

A. Katz, Linearization: Reducing Distortion in Power Amplifiers, IEEE Microwave Magazine, vol. 2, issue 4, Dec. 2001, pp. 37-49.
(Continued)

*Primary Examiner* — Rahel Guarino
(74) *Attorney, Agent, or Firm* — Christopher P. Maiorana, PC

(57) ABSTRACT

An analog predistortion linearizer system with dynamic frequency compensation for automatically adjusting predistortion characteristics based on a detected frequency includes a frequency detector configured to generate at least one frequency detection signal in response to receiving an amplifier drive signal, the frequency detection signal including a frequency indicator that indicates the frequency of the amplifier drive signal. Moreover, the system also includes a controller communicatively coupled to the frequency detector and configured to generate a predistorter control signal in response to receiving the frequency detection signal from the frequency detector, and a predistorter communicatively coupled to i) the frequency detector and ii) the controller, the predistorter configured to generate a predistorted amplifier drive signal based on at least the predistorter control signal.

14 Claims, 11 Drawing Sheets

Related U.S. Application Data

(60) Provisional application No. 62/133,827, filed on Mar. 16, 2015.

(58) Field of Classification Search
CPC .................. H03F 1/32; H03F 2200/451; H03F 2201/3227; H03F 2200/321; H03F 2200/438; H04B 2001/0425; H04B 10/58; H04L 27/368; H04L 27/361; H04L 27/366; H03G 3/3042; H03G 2201/206; H03G 2201/307; H03C 5/00; H03C 1/00; H03C 3/08
See application file for complete search history.

(56) References Cited

U.S. PATENT DOCUMENTS

| | | | |
|---|---|---|---|
| 4,122,399 A | | 10/1978 | Heiter et al. |
| 4,255,714 A | | 3/1981 | Rosen |
| 5,038,113 A | | 8/1991 | Katz et al. |
| 5,523,716 A | | 6/1996 | Grebliunas et al. |
| 6,118,339 A | | 9/2000 | Gentzler et al. |
| 6,147,555 A | * | 11/2000 | Posner .................. H03F 1/3229 330/107 |
| 7,058,369 B1 | | 6/2006 | Wright et al. |
| 9,793,932 B2 | * | 10/2017 | Deckman ............. H04B 1/0475 |
| 2006/0276147 A1 | | 12/2006 | Suzuki et al. |
| 2011/0187453 A1 | | 8/2011 | Deckman et al. |
| 2012/0242405 A1 | | 9/2012 | Chung |
| 2018/0006615 A1 | * | 1/2018 | Halperin ................. H03F 3/245 |

OTHER PUBLICATIONS

D. Hall, "Understanding Intermodulation Distortion Measurements," Electronic Design.com, Oct. 9, 2013, available at "http://electronicdesign.com/communications/understanding-intermodulation-distortion-measurements," Last accessed on Apr. 5, 2017.

* cited by examiner

SYSTEMS AND METHODS FOR A PREDISTORTION LINEARIZER WITH FREQUENCY COMPENSATION

CROSS-REFERENCE TO RELATED APPLICATION

This application is the nonprovisional application of provisional application, Ser. No. 62/133,827, filed on Mar. 16, 2015, which is incorporated by reference in its entirety herein.

FIELD OF INVENTION

This disclosure generally relates to predistortion conditioning for a power amplifier, and more specifically, to a predistortion linearizer includes frequency compensation in preconditioning a drive signal for a power amplifier.

BACKGROUND

Microwave and millimeter-wave communications systems are used in many applications, including satellite communications, terrestrial point-to-point communications, and backhaul communications for cellular networks. Typically, a communications transmitter includes a high power amplifier to increase the power of the signal to levels adequate to reach a distant receiver with sufficient strength. It is important that these communications transmitters preserve the fidelity or the "linearity" of the communications signals to avoid unnecessary distortion.

Typically, a high power amplifier will add some undesirable distortion to signals during the amplification process. For example, as the power for an input drive signal increases, an amplifier will amplify the drive signal by a proportionate gain. However, when the power of the input drive signal reaches a certain level, the amplifier begins to become saturated and is no longer capable of amplifying the drive signal by a proportionate gain. In other words, as the amplifier becomes saturated at these higher input power levels of the drive signal, the amplifier begins to add saturation distortion to the amplified output. Thus, the high-power amplifier will not produce sufficient gain and adds amplitude distortion to the output signal above a certain level of input drive power. In addition, the phase of the output signal can also become distorted as the amplifier saturates which further compounds the saturation distortion problem. This amplitude (also referred to as magnitude) and phase distortion result in a loss of fidelity of the output signal, and will limit the capacity of the communications system.

Conventional amplifier designers have attempted to mitigate this distortion characteristic of the amplifier by coupling a predistorter device to the amplifier. The predistorter attempts to counteract the distortion characteristics of the amplifier by preconditioning the drive signal before amplification. For example, a predistorter may add an inverse gain magnitude and inverse gain phase saturation distortion characteristics to the drive signal before amplification. Thus, when the predistorted drive signal is amplified, the inverse magnitude and inverse phase saturation distortion characteristics will counteract the saturation magnitude and phase distortion added during amplification. As a result, the operating power levels of an amplifier may be extended into much higher power levels without exhibiting much distortion. These devices are said to extend the linear output power of the high power amplifier. The benefits of using linearization techniques to extend the useful power of a high-power amplifier are well documented.

However, many amplification applications require the use of more than one frequency, and some applications may even require the use of an entire broad frequency band. Generally, power amplifiers exhibit different saturation distortion characteristics for drive signals of different frequencies. In other words, the amplifier distortion characteristics of a particular amplifier will change over the frequency of a band of interest. This difference in saturation distortion characteristics of an amplifier becomes even more pronounced for wideband applications that require a greater range in frequencies in an operating bandwidth. It is often quite difficult to design a conventional predistorter to counteract the amplifier's gain magnitude and phase saturation over a wide frequency band, especially if the amplifier's gain magnitude and phase saturation vary significantly over this band. As a result, while conventional predistorters may help extend the operating range for an amplifier at one particular frequency, those conventional predistorters are often inadequate for applications that require amplification for an entire band of frequencies.

SUMMARY

An analog predistortion linearizer system with dynamic frequency compensation for automatically adjusting predistortion characteristics based on a detected frequency includes a frequency detector configured to generate at least one frequency detection signal in response to receiving an amplifier drive signal, the frequency detection signal including a frequency indicator that indicates the frequency of the amplifier drive signal. Moreover, the system also includes a controller communicatively coupled to the frequency detector and configured to generate a predistorter control signal in response to receiving the frequency detection signal from the frequency detector, and a predistorter communicatively coupled to i) the frequency detector and ii) the controller, the predistorter configured to generate a predistorted amplifier drive signal based on at least the predistorter control signal.

According to one embodiment, an analog predistortion linearizer system with dynamic frequency compensation automatically adjusts predistortion characteristics based on a detected frequency. The system includes a frequency detector configured to generate at least one frequency detection signal in response to receiving an amplifier drive signal. The frequency detection signal includes an frequency indicator that indicates a frequency of the amplifier drive signal. A controller communicatively is coupled to the frequency detector and is configured to generate at least one predistorter control signal in response to receiving the at least one frequency detection signal from the frequency detector. A predistorter communicatively coupled to the frequency detector and the controller. The predistorter is configured to generate a predistorted amplifier drive signal based on at least the predistorter control signal.

According to another embodiment, a processor-executable method automatically adjusts predistortion characteristics of a radio frequency signal includes receiving a radio frequency signal. The method detects a frequency value in response to the receiving. The method further includes generating a predistortion control signal in response to the detected frequency value. The method also generates predistortion signal to the radio frequency signal such that the generated predistortion signal counteracts a gain magnitude and phase distortion of an amplifier when processing the radio frequency signal.

A predistortion linearizer apparatus with dynamic frequency compensation automatically adjusts predistortion characteristics based on a detected frequency. A predistorter for receiving a drive signal. A frequency detector is communicatively coupled to the predistorter. The predistorter communicates the received drive signal with the frequency detector. The frequency detector generates a frequency detection signal in response to the received drive signal. The frequency detection signal includes a frequency indicator that indicates a frequency of the drive signal. A controller is communicatively coupled to the frequency detector and the predistorter. The controller generates a predistorter control signal in response to receiving the at least one frequency detection signal from the frequency detector. The apparatus further includes the predistorter generating a predistorted drive signal based on the predistorter control signal.

BRIEF DESCRIPTIONS OF THE DRAWINGS

Corresponding reference characters indicate corresponding parts throughout the drawings.

DETAILED DESCRIPTION

Figure 1:
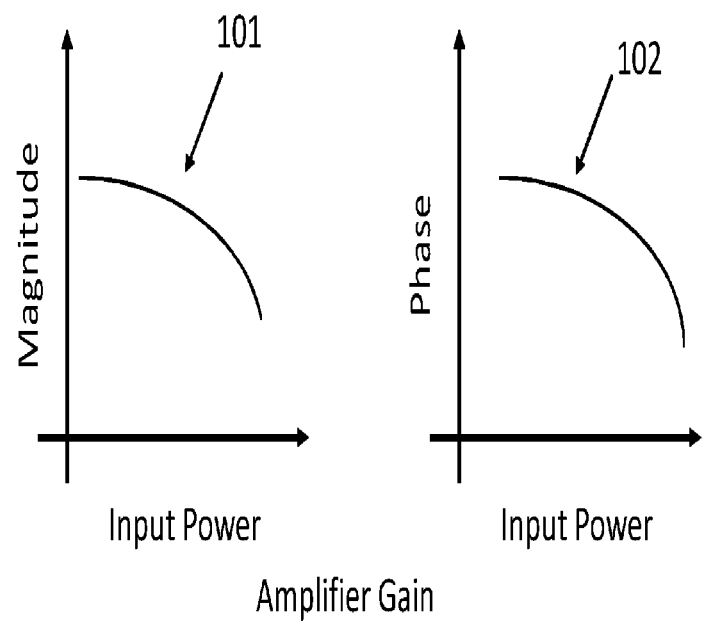
FIG. 1 depicts a gain magnitude distortion response graph and a gain phase distortion response graph for a drive signal being amplified over a range of input power levels according to prior art.

FIG. 1 shows a typical amplifier's gain magnitude saturation curve 101 and gain phase saturation curve 102 as a function of input power according to prior art. As has been discussed previously, as the input power increases, the amplifier's gain magnitude and phase begin to change as the amplifier saturates. This is true for any high-power amplifier, including both vacuum-tube amplifiers as well as solid-state amplifiers. FIG. 1 shows the amplifier gain magnitude decreasing with increasing drive 101, which is the usual case. Some amplifiers, however, may exhibit behavior where the gain magnitude actually increases over a certain range of input powers, before ultimately decreasing. FIG. 1 also shows that the phase of the amplifier's gain decreasing with increasing drive 102, but it should be noted that this phase response is not universal. Some amplifiers may show phase reduction with increasing drive, while others may show a phase increase with increasing drive, while other amplifiers may show both behaviors.

Figure 2:
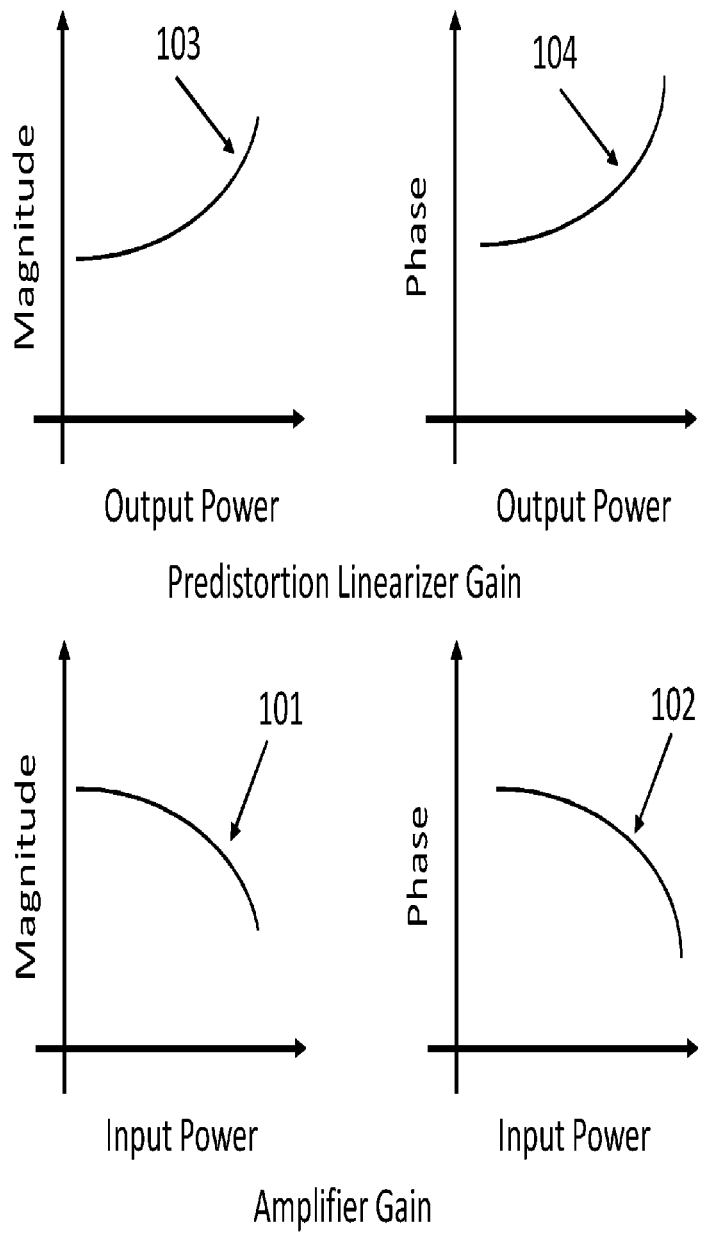
FIG. 2 depicts a gain magnitude and phase distortion response graph for a predistortion linearizer configured to substantially counteract the gain and phase distortion response of an amplifier according to prior art.

FIG. 2 illustrates the concept of predistortion according to prior art. A predistorter attempts to correct the inevitable magnitude and phase distortion introduced by a high power amplifier by intentionally pre-distorting the signal input to the amplifier with essentially opposite characteristics. In this example, the predistorter's gain magnitude curve 103 has an opposite shape to the amplifier's gain magnitude distortion curve 101: while the magnitude of the amplifier gain decreases with increasing power, the magnitude of the predistorter gain increases with increasing power. These two effects will effective cancel each other out, resulting in a gain magnitude that is essentially constant over a wide range of power levels. The system's gain amplitude is said to have been "linearized." An identical approach can be applied to linearize the gain phase saturation. In this example, the predistorter's gain phase curve 104 has an opposite shape to the amplifier's gain phase distortion curve 102. Again, in this illustrative example the phase of the predistorter gain increases with power to counteract the decreasing phase of the amplifier gain, but different characteristics can exist.

Figure 3:
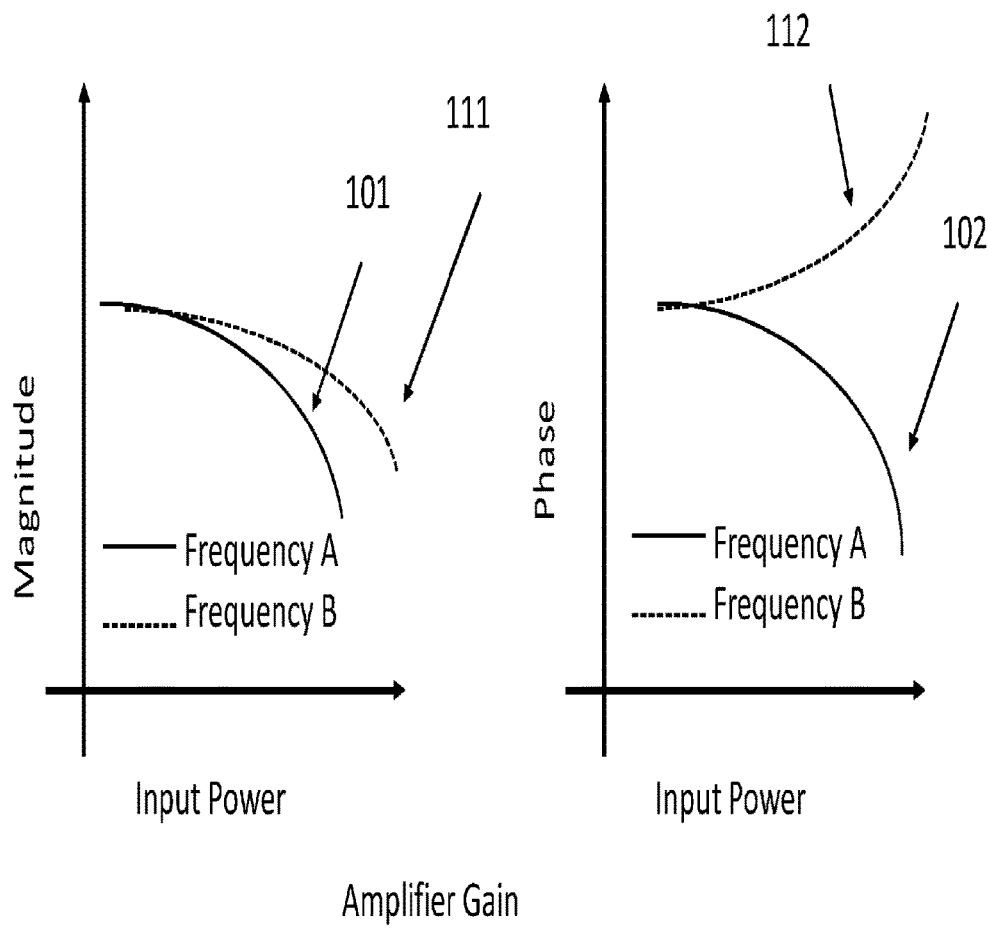
FIG. 3 depicts a gain magnitude distortion response graph and a gain phase distortion response graph for a drive signal being amplified over a range of input power levels at two different operating frequencies according to one embodiment of the invention.

FIG. 2 also shows near ideal predistortion, but it is important to stress that these amplifier distortion curves 101,102 and predistorter distortion curves 103, 104 are shown at a single frequency of operation. Real communications systems have to operate of a band of frequencies, and this band can be quite wide: spanning several octaves or decades. Although the bandwidth of a signal passing through the amplifier may be quite narrow at any one instant of time (the instantaneous bandwidth), the amplifier must be able to linearly amplify any such signal or signals existing in a wide bandwidth. The saturation characteristics of a high-power amplifier and the distortion characteristics of a predistortion linearizer may change considerably over this wide bandwidth. This is illustrated in FIG. 3, which shows a representative amplifier's gain magnitude saturation curve at two different frequencies in the band 101, 111. Note that the amplifier's gain magnitude saturation at frequency "B" 111 occurs at higher input power levels than the amplifier's gain magnitude saturation at frequency "A" 101. The amplifier's gain phase saturation curves at the two frequencies are markedly different. The amplifier's gain phase at frequency "A" 102 decreases with increasing input power, whereas the gain phase at frequency "B" 112 increases with increasing input power.

With FIG. 3 in mind, one skilled in the art would appreciate how designing a predistorter to optimally correct the amplifier's distortion characteristics at frequency "A" (e.g. a predistorter having a characteristic like the one illustrated in FIG. 2) would result in a system that does not work well at frequency "B". That is, the predistorter would have a gain phase characteristic that is increasing with power (to counteract the amplifier's decreasing phase at frequency "A"), but this would result in actually making the total system's phase distortion worse at frequency "B" (because the linearizer's phase and the amplifier's phase are both increasing with power at this frequency). The result is that a designer of a predistortion linearizer faces a difficult task, in trying to optimally align the linearizer's gain magnitude and phase to counteract the amplifier's gain magnitude and phase not only over a wide range of power levels, but a wide range of frequencies as well. This balancing act can be difficult to achieve, and the designer will often have to come up with a compromise solution that works only marginally well across the frequency band.

Embodiments of the invention disclosed herein solve this challenge by introducing dynamic frequency compensation to improve the linear operating power of an amplifier over a bandwidth of frequencies. The predistortion linearizer system may receive an input drive signal intended for a high power amplifier and condition the drive signal for the high power amplifier based on at least a detected frequency of the drive signal. For example, the predistortion linearizer system may include a frequency detector that determines a frequency of a received input drive signal and provides the detected frequency value to a controller. In response to receiving the frequency value, the controller may determine predistorter control signal that indicates a gain amplitude and phase predistortion characteristic for the amplifier at the particular detected frequency. In response to the predistorter receiving the predistorter control signal, the predistorter may precondition the drive signal to exhibit the inverse of the gain amplitude and phase predistortion characteristic for the amplifier. As a result, when the amplifier amplifies the preconditioned drive signal, the distortion characteristics for the amplifier at the detected frequency are equalized, and the operating power level of the amplifier is extended. Advantageously, the predistortion linearizer system with frequency compensation allows a high power amplifier to be optimized over an entire operating bandwidth without compromising the performance of one particular frequency or band over another frequency or band within the operating bandwidth.

Figure 4A:
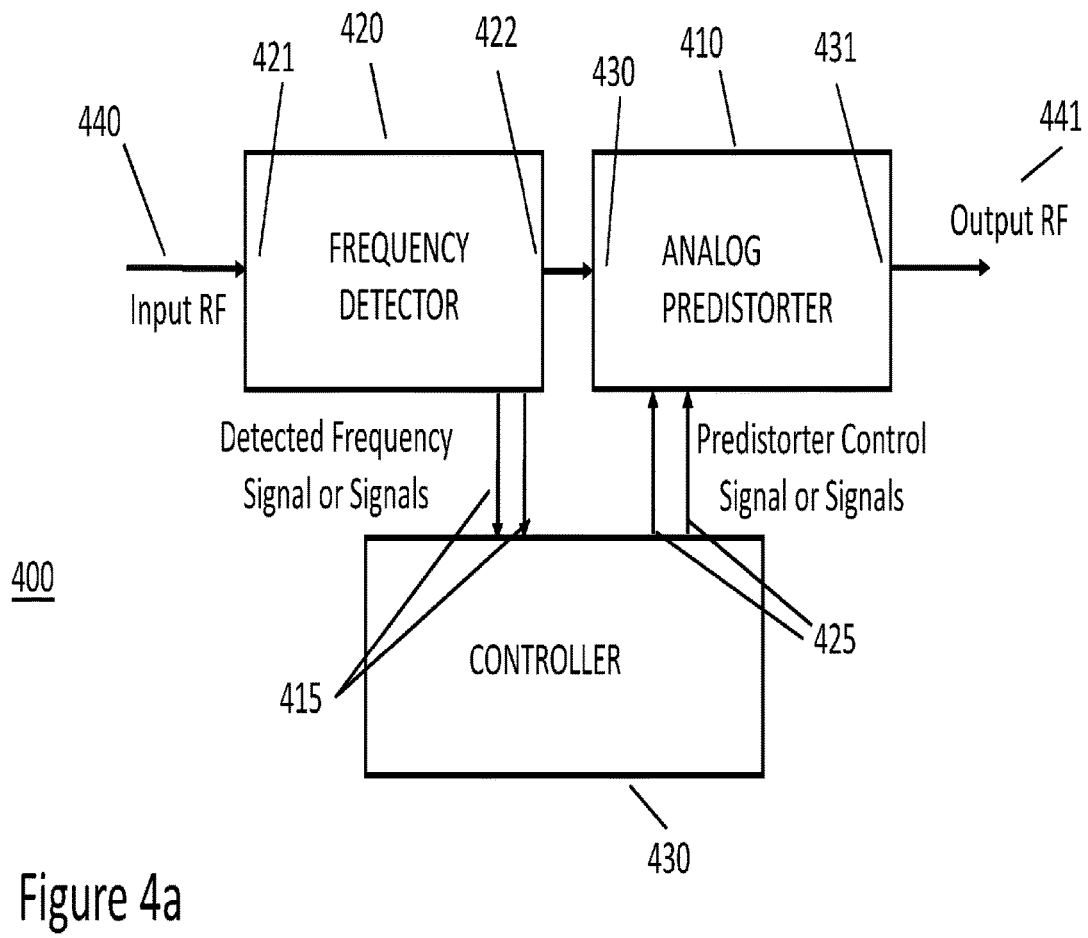
FIGS. 4a and 4b illustrate a block diagram for an exemplary predistortion linearizer system that includes frequency compensation according to one embodiment of the invention.
Figure 4B:
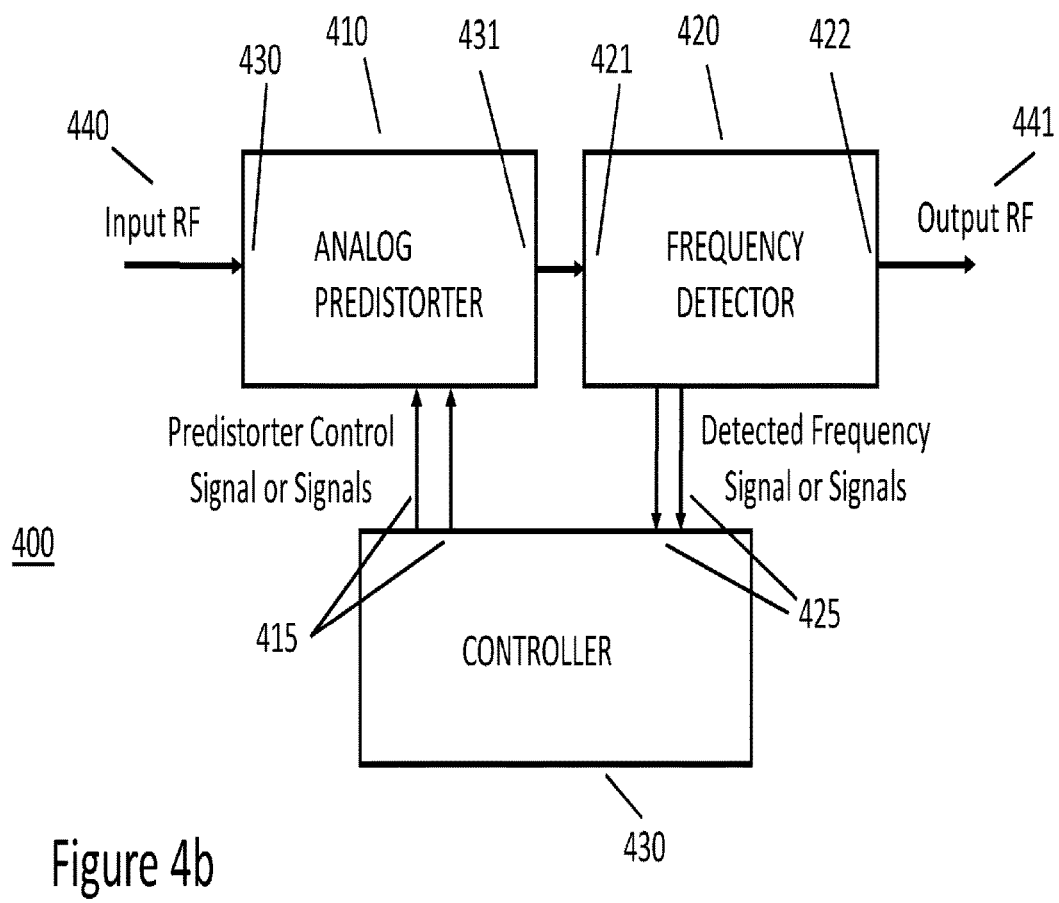

As illustrated in FIG. 4a, an exemplary predistortion linearizer system 400 with dynamic frequency compensation may include a frequency detector 420 that is communicatively coupled with an analog predistorter 410 and a controller 430, and in turn, the controller 430 may be communicatively coupled with the predistorter. Although the frequency detector 420, as shown in FIG. 4a, receives the input drive signal 440, the analog predistorter may alternatively receive the drive signal before providing the signal to the frequency detector, as is illustrated in FIG. 4b. Therefore, it is to be understood that embodiments of the invention enable the communications between the frequency detector 420 and the predistorter 410 without being limited to the direction of the signal flow between these two devices. For example, the frequency detector 420 may detect the drive signal frequency and then provide the drive signal to the predistorter 410, or alternatively, the frequency detector 420 may receive the preconditioned drive signal from the predistorter 410 and then detect that preconditioned drive signal frequency. The ordering of the predistorter 410 and the frequency detector 420 is therefore not important to the overall functioning of the system and FIGS. 4a and 4b showing the directional arrows are for illustration purposes and not limiting embodiments of the invention. Regardless of the predistortion system configuration, the frequency detector 420 may detect the frequency substantially maintaining or without substantially changing the characteristics of the drive signal. The system works together to tune or optimize the analog predistorter to best correct the magnitude and phase nonlinearities of a subsequent amplifier based on the frequency of the signal.

Still referencing FIG. 4a, the analog predistorter 410 accepts a radio frequency RF signal at its input 430, and adds the suitable predistorter gain amplitude and phase distortion characteristics necessary to counteract the subsequent amplifier's gain magnitude and phase distortion. The predistorter's gain magnitude and phase characteristics can be adjusted or "tuned" through one or more predistorter control signals 415.

Figure 5A:
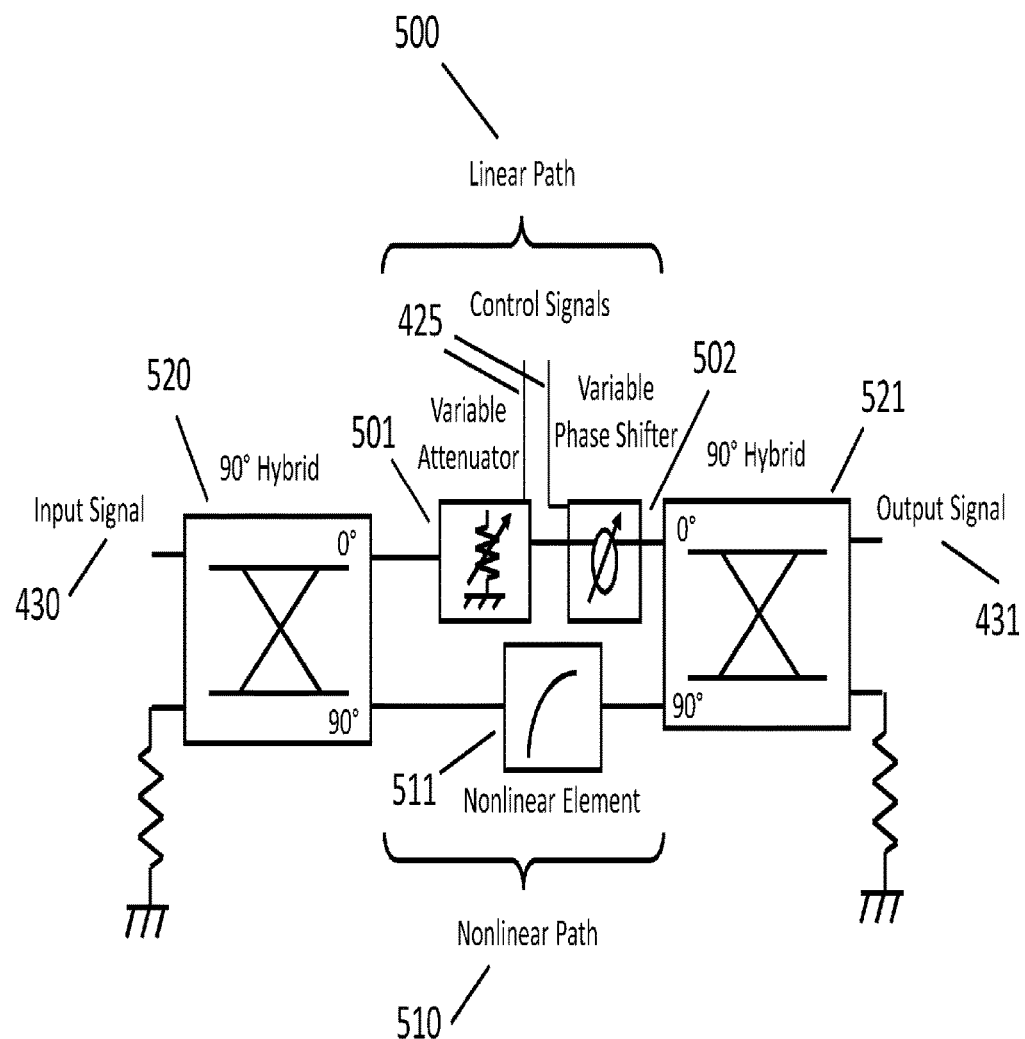
FIGS. 5a and 5b depict prior art examples of different types predistortion linearizers.
Figure 5B:
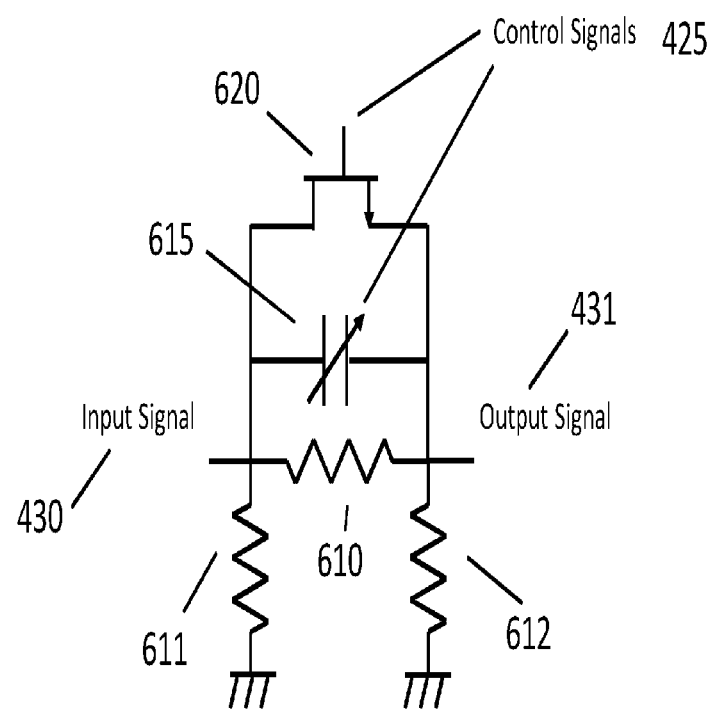

There are many examples of how the analog predistorter 410 may be implemented. FIGS. 5a and 5b show two illustrative examples. FIG. 5a shows a popular approach, wherein the signal at the input port 430 is divided and directed along two separate paths: a linear path 500 and a nonlinear path 510. The signals are then recombined with appropriate phase shifts and attenuation to achieve a desired predistorter magnitude and phase distortion This approach is known. In this illustration, two 90-degree hybrids 520, 521 are used to split the signal into the linear and nonlinear path. The nonlinear path contains a nonlinear element 510. The linear path may contain variable phase shifters 502 and variable attenuators 501. These variable components may be controlled by one or more control signals 425. Adjusting these control signals will in turn change the shape of the predistorter's gain magnitude and phase distortion characteristics, and these signals can be used to optimize the performance over the specified range of frequencies.

Another example of an analog predistortion linearizer is shown in FIG. 5b. In this example, a nonlinear element is inserted into a circuit with a pi-network topology in order to achieve the desired necessary predistorter gain magnitude and phase distortion. In this example, for illustrative purposes only, the nonlinear element is a FET 620, and the pi-network consists of three resistors 610, 611, 612 and a variable capacitor 615 bridging the central resistor 610. Control signals 425 are used to control both the FET 620 and the variable capacitor 615. Adjusting these control signals will in turn change the shape of the predistorter's gain magnitude and phase distortion characteristics, and these signals can be used to optimize the performance over the specified range of frequencies.

It is important to stress that the analog predistorters shown in FIGS. 5a and 5b are for illustrative purposes only. One skilled in the art may recognize that there are many possible analog predistortion linearizer architectures that would be suitable to be used with the frequency compensation taught herein.

Looking back again to FIG. 4a, the frequency detector operates by receiving an input radio frequency RF signal at its input 421 and passing this RF signal to its output 422 substantially maintaining or without substantially changing the characteristics of this RF signal. For example, the frequency detector does not, in general, add modulation or filtering to the RF signal, nor does it, in general, add any distortion or pre-distortion. The frequency detector generates a detected frequency signal or signal based on the frequency of the RF signal.

Figure 6A:
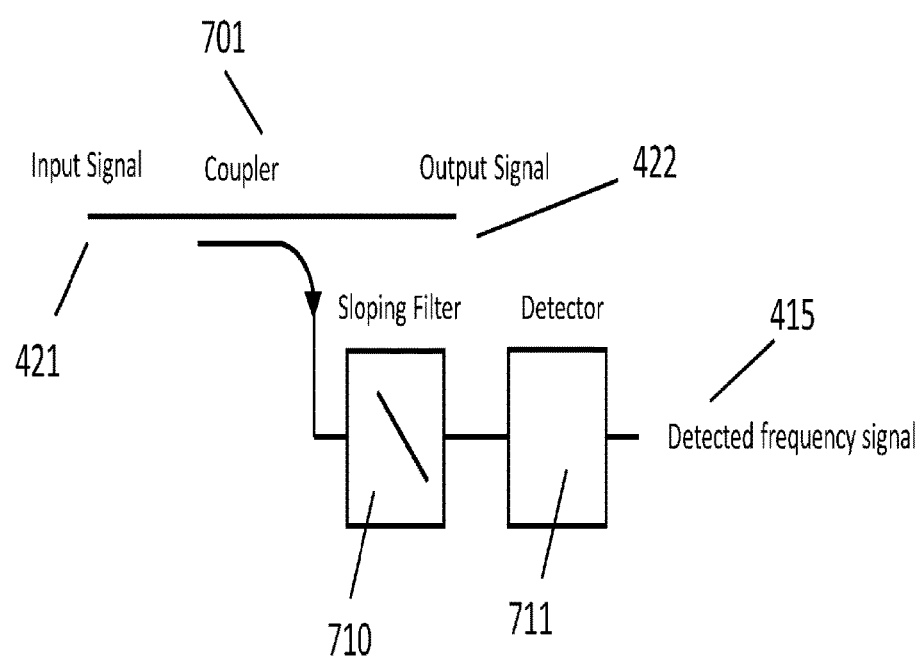
FIGS. 6a, 6b and 6c illustrate prior art examples of different types of frequency detection networks.
Figure 6B:
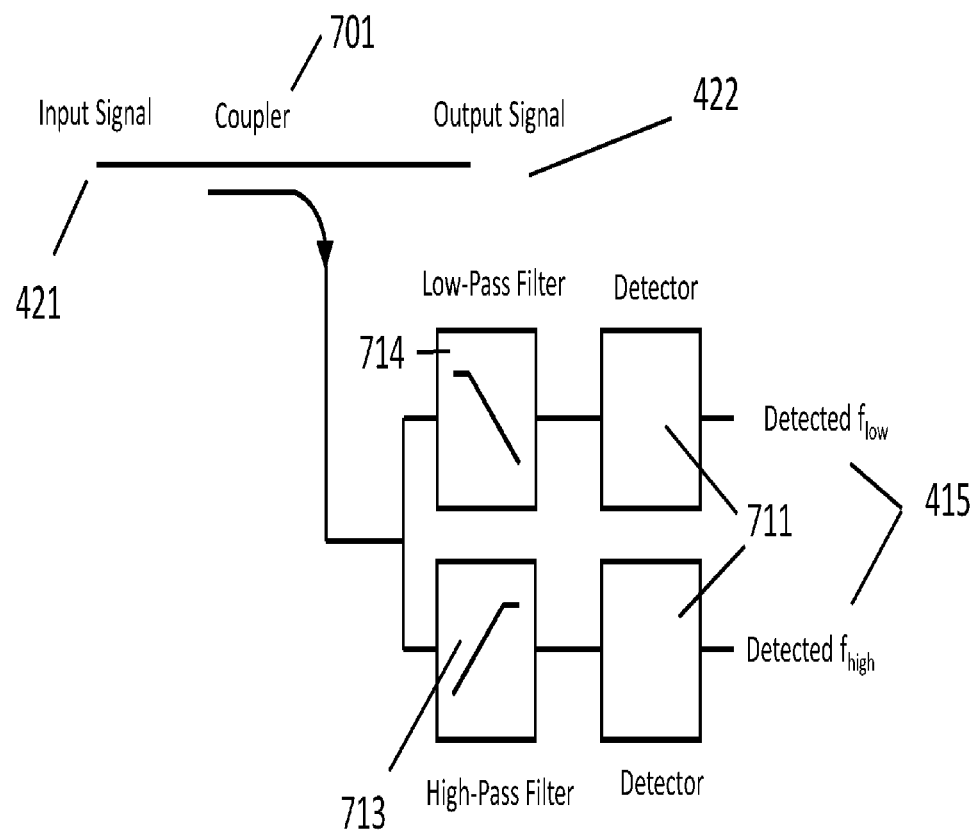
Figure 6C:
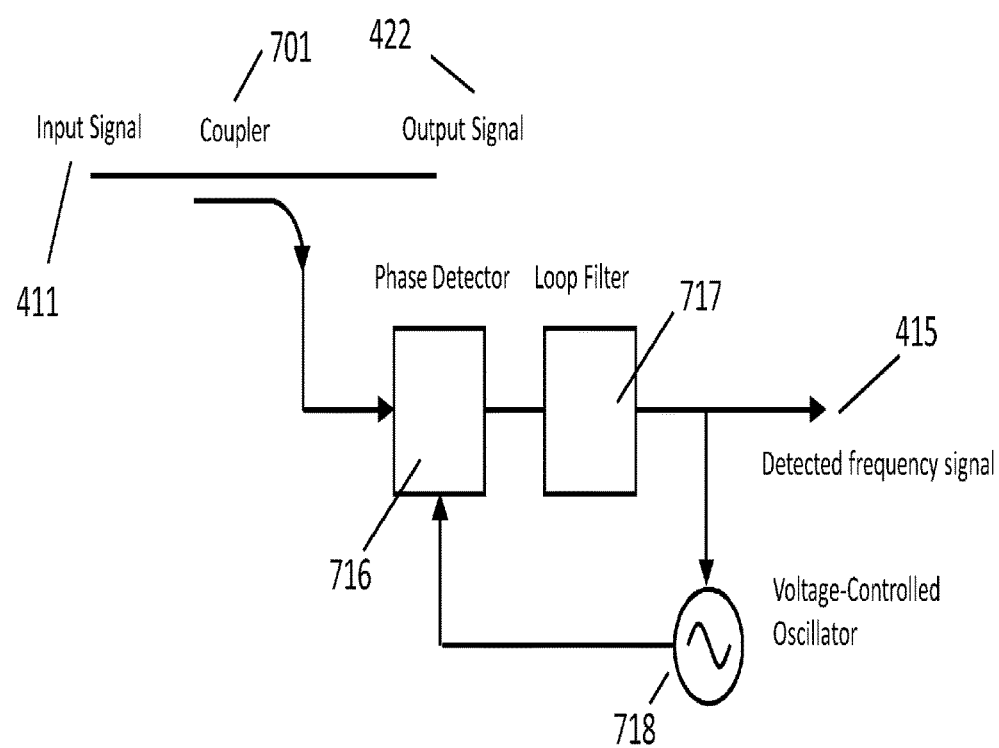
Figure 7:
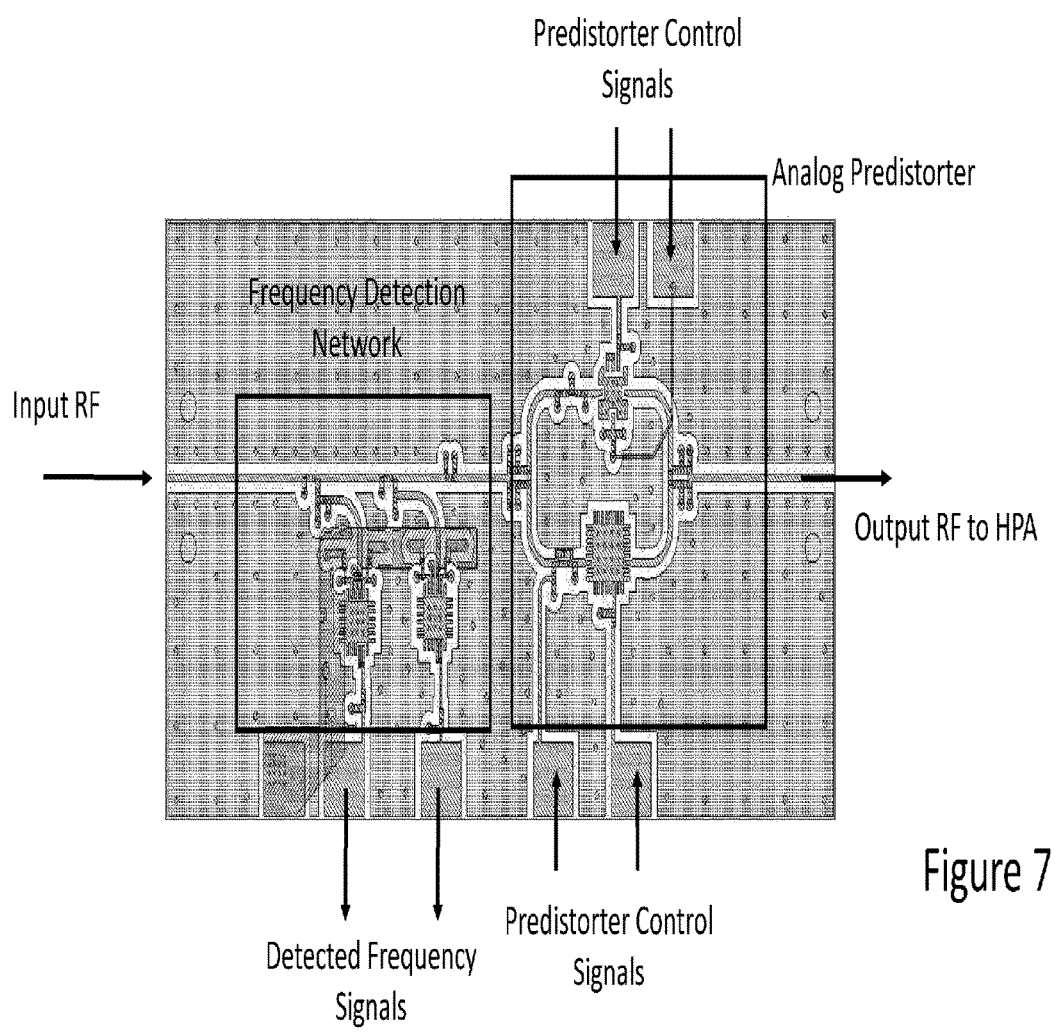
FIG. 7 illustrates an exemplary circuit board layout for a predistortion linearizer system with a frequency detection module and a predistortion linearizer.

There are many ways that the frequency detector can be implemented. For example, the frequency detector may determine the frequency of the drive signal utilizing a frequency discriminator (e.g., a Foster-Seeley discriminator, a ratio discriminator, etc.), a phase-locked loop (PLL), or any other suitable manner of determining the frequency of the drive signal. Alternatively, the frequency detector may include a downconverter that may downconvert the drive signal to a lower intermediate frequency. In this alternative example, the intermediate frequency may be digitized with an analog-to-digital converter for determining the frequency using one or more digital signal processing methods. FIGS. 6a-6c show three well-known methods. FIG. 6a shows a frequency discriminator based on a slope detection circuit. A coupler 701 is used to sample a portion of the RF signal. This sampled portion passes through a steeply sloping filter 710 and then a power detector 711. The strength of the signal from the power detector will indicate the frequency of the RF signal. In this example, the slope detector passes lower frequencies and attenuates higher frequencies, so the output of the detector will be inversely proportional to the RF signal frequency. FIG. 6b shows a refinement of this approach, where the coupler 701 samples a portion of the RF signal and passes it through two filters: a low-pass filter 714 and a high-pass filter 713, each being followed by a subsequent detector 711. By comparing the relative strengths of these two detected signals 415, one should be able to determine the frequency of operation. Finally, FIG. 6c shows a third possible architecture for the frequency detector. In this case, the sampled portion of the RF signal is processed by a phase-locked-loop circuit, consisting of a phase detector 716, a loop filter 717 and a voltage controlled oscillator 718. The voltage controlling the voltage controlled oscillator will contain the information necessary to determine the RF operating frequency. Again, it is important to stress that the frequency detectors shown in FIG. 6 are for illustrative purposes only. One skilled in the art may recognize that there are many possible frequency detector architectures that would be suitable to be used with the frequency compensation taught herein.

After the frequency detector determines a value of the instantaneous frequency of the drive signal, the frequency detector may provide the frequency value as an analog or digital signal to the controller, as shown in FIGS. 4a-4b. In response to receiving the frequency value, the controller may determine one or more desired predistorter control signal or signals based on the received frequency value. For example, the controller may include an operational amplifier (i.e., op-amp) circuit that includes one or more op-amps that may process the received analog based frequency value and, in turn, may generate the proper predistortion signal(s) for the predistorter. Alternatively, the controller may include a microcontroller that includes one or more processors and a memory in which the one or more processors may execute instructions stored on the memory.

In continuing this alternative example, the microcontroller may receive the digitized frequency value (or the microcontroller may be combined with the frequency detector to determine the digitized frequency) utilize a programmable lookup table to determine a predistorter control signal. This programmable lookup table may be generated during an initial alignment and/or calibration setup phase. The lookup table, in addition to a detected frequency value, may incorporate additional factors or variables, such as temperature, for example, to further refine the determination and subsequent generation of one or more predistortion control signals. Regardless of the manner implemented, the controller may convert the digital result of the lookup table into an analog signal, using a digital-to-analog converter, to generate the predistorter control signal.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

Still further, the figures depict preferred embodiments of a predistortion linearizer system for purposes of illustration only. One skilled in the art will readily recognize from the foregoing discussion that alternative embodiments of the structures and methods illustrated herein may be employed without departing from the principles described herein. Thus, upon reading this disclosure, those of skill in the art will appreciate still additional alternative structural and functional designs for a predistortion linearizer system through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for automatically adjusting predistortion characteristics of a drive signal comprising the steps of:
    detecting, via a frequency detector, a frequency value of the drive signal, wherein the frequency value is generated as an analog signal;
    generating, via a controller, at least one control signal in response to the frequency value, wherein the controller comprises either (i) one or more operational amplifiers configured to generate the control signal or (ii) a memory circuit configured to store instructions and one or more processors configured to execute the instructions to generate the control signal; and
    modifying, via a predistorter, the drive signal based on the control signal, wherein the at least one control signal comprises (i) a first control signal that controls an attenuation of the drive signal and (ii) a second control signal that controls a phase shift of the drive signal.

2. The method of claim 1, further comprising the step of: communicating the drive signal through the frequency detector while substantially maintaining characteristics of the drive signal.

3. The method of claim 1, further comprising the step of: amplifying the drive signal after the modification.

4. The method of claim 3, wherein the modification of the drive signal comprises modifying a gain amplitude characteristic and a phase distortion characteristic to counteract a gain amplitude property and a phase distortion property of the amplification.

5. The method of claim 1, wherein the drive signal comprises a radio frequency signal.

6. The method of claim 1, further comprising the steps of: generating a digital frequency value by digitizing the frequency value;
generating at least one digital control signal by processing the digital frequency value; and
generating the control signal in analog form by a digital-to-analog conversion of the digital control signal.

7. An apparatus comprising:
a frequency detector configured to detect a frequency value of a drive signal;
a controller comprising one or more linear analog circuits configured to generate at least one control signal in response to the frequency value; and
a predistorter configured to modify the drive signal based on the control signal, wherein the apparatus implements an analog predistortion linearizer system with dynamic frequency compensation for automatically adjusting predistortion characteristics based on the frequency value as detected, wherein the at least one control signal comprises (i) a first control signal that controls an attenuation of the drive signal and (ii) a second control signal that controls a phase shift of the drive signal.

8. The apparatus of claim 7, further comprising an amplifier configured to amplify the drive signal after the modification.

9. The apparatus of claim 7, wherein the drive signal comprises a radio frequency signal.

10. The apparatus of claim 7, wherein the frequency detector detects the frequency value after the predistorter modifies the drive signal.

11. An apparatus comprising:
a frequency detector configured to detect a frequency value of a drive signal;
a controller configured to generate at least one control signal in response to the frequency value, wherein the controller comprises a memory circuit configured to store instructions and one or more processors configured to execute the instructions to generate the control signal; and
a predistorter configured to modify the drive signal based on the control signal, wherein the apparatus implements a predistortion linearizer system with dynamic frequency compensation for automatically adjusting predistortion characteristics based on the frequency value as detected, wherein the controller is further configured to (i) generate a digital frequency value by digitizing the frequency value, (ii) generate at least one digital control signal by processing the digital frequency value and (iii) generate the control signal in analog form by a digital-to-analog conversion of the digital control signal.

12. The apparatus of claim 11, further comprising an amplifier configured to amplify the drive signal after the modification.

13. The apparatus of claim 11, wherein the drive signal comprises a radio frequency signal.

14. An apparatus comprising:
a frequency detector configured to detect a frequency value of a drive signal;
a controller configured to generate at least one control signal in response to the frequency value, wherein the controller comprises a memory circuit configured to store instructions and one or more processors configured to execute the instructions to generate the control signal; and
a predistorter configured to modify the drive signal based on the control signal, wherein the apparatus implements a predistortion linearizer system with dynamic frequency compensation for automatically adjusting predistortion characteristics based on the frequency value as detected, wherein the at least one control signal comprises (i) a first control signal that controls an attenuation of the drive signal and (ii) a second control signal that controls a phase shift of the drive signal.

* * * * *